(12) United States Patent
Kim (10) Patent No.: US 11,964,586 B2
(45) Date of Patent: Apr. 23, 2024

(54) BATTERY MANAGEMENT SYSTEM, BATTERY MANAGEMENT METHOD, BATTERY PACK AND ELECTRIC VEHICLE

(71) Applicant: LG Energy Solution, Ltd., Seoul (KR)

(72) Inventor: Jong-Wan Kim, Daejeon (KR)

(73) Assignee: LG Energy Solution, Ltd., Seoul (KR)

(*) Notice: Subject to any disclaimer, the term of this patent is extended or adjusted under 35 U.S.C. 154(b) by 443 days.

(21) Appl. No.: 17/429,416

(22) PCT Filed: Sep. 15, 2020

(86) PCT No.: PCT/KR2020/012441
§ 371 (c)(1),
(2) Date: Aug. 9, 2021

(87) PCT Pub. No.: WO2021/060761
PCT Pub. Date: Apr. 1, 2021

(65) Prior Publication Data
US 2022/0126726 A1    Apr. 28, 2022

(30) Foreign Application Priority Data

Sep. 23, 2019  (KR) .................. 10-2019-0116945

(51) Int. Cl.
*B60L 58/12* (2019.01)
*G01R 31/382* (2019.01)
(Continued)

(52) U.S. Cl.
CPC ............ *B60L 58/12* (2019.02); *G01R 31/382* (2019.01); *G01R 31/50* (2020.01);
(Continued)

(58) Field of Classification Search
CPC ...................................................... B60L 58/12
(Continued)

(56) References Cited

U.S. PATENT DOCUMENTS

| 7,734,317 B2* | 6/2010 | Patel ........................ H02J 7/34 455/574 |
| 2009/0146610 A1 | 6/2009 | Trigiani |

(Continued)

FOREIGN PATENT DOCUMENTS

| CA | 3101535 A1 | 9/2015 |
| CN | 102738525 A | 10/2012 |

(Continued)

OTHER PUBLICATIONS

Extended European Search Report including Written Opinion for Application No. 20869128.7 dated Jul. 28, 2022, pp. 1-5.

(Continued)

*Primary Examiner* — Yalkew Fantu
(74) *Attorney, Agent, or Firm* — Lerner David LLP (57) ABSTRACT

A battery management system including a first connection unit, a first slave controller and a master controller. The first connection unit electrically connects a first battery cell included in a first battery group to the first slave controller. Power from the first battery group is supplied to the first slave controller through a first power line included in the first connection unit. The first slave controller determines a first reference voltage value indicating a voltage of the first battery cell during the execution of the first communication mode, and determines a first comparative voltage value indicating a voltage of the first battery cell during the execution of the second communication model. The master controller determines whether the first power line has an open circuit fault based on the first reference voltage value and the first comparative voltage value.

13 Claims, 6 Drawing Sheets

(51) Int. Cl.
*G01R 31/50* (2020.01)
*H01M 10/42* (2006.01)
*H01M 10/48* (2006.01)

(52) U.S. Cl.
CPC ..... *H01M 10/4207* (2013.01); *H01M 10/425* (2013.01); *H01M 10/482* (2013.01); *H01M 2010/4271* (2013.01); *H01M 2010/4278* (2013.01); *H01M 2220/20* (2013.01)

(58) Field of Classification Search
USPC ......................................................... 320/132
See application file for complete search history.

(56) References Cited

U.S. PATENT DOCUMENTS

| | | | |
|---|---|---|---|
| 2010/0259221 A1 | 10/2010 | Tabatowski-Bush | |
| 2013/0099740 A1 | 4/2013 | Takashima et al. | |
| 2014/0001985 A1 | 1/2014 | Zhang et al. | |
| 2015/0207410 A1 | 7/2015 | Ono | |
| 2015/0280466 A1 | 10/2015 | Owen et al. | |
| 2015/0309121 A1 | 10/2015 | Butzmann | |
| 2016/0261127 A1* | 9/2016 | Worry .................. | H02J 7/0029 |
| 2017/0207637 A1 | 7/2017 | Sugeno et al. | |
| 2018/0136286 A1 | 5/2018 | Cois et al. | |
| 2018/0172769 A1 | 6/2018 | Yoon et al. | |
| 2019/0074491 A1 | 3/2019 | Kim et al. | |
| 2019/0227863 A1 | 7/2019 | Cho et al. | |
| 2019/0252735 A1* | 8/2019 | Sung .................. | H01M 10/482 |
| 2019/0361075 A1* | 11/2019 | Lee .................. | H01M 10/4207 |
| 2020/0106278 A1 | 4/2020 | Sung et al. | |
| 2021/0109492 A1 | 4/2021 | Song et al. | |

FOREIGN PATENT DOCUMENTS

| | | |
|---|---|---|
| CN | 104467040 A | 3/2015 |
| CN | 107128191 A | 9/2017 |
| CN | 107487223 A | 12/2017 |
| CN | 110178261 A | 8/2019 |
| DE | 102015212176 A1 | 12/2016 |
| JP | H09223080 A | 8/1997 |
| JP | 2846660 B2 | 1/1999 |
| JP | 2005261193 A | 9/2005 |
| JP | 6237566 B2 | 11/2017 |
| KR | 101527546 B1 | 6/2015 |
| KR | 101695641 B1 | 1/2017 |
| KR | 101700805 B1 | 1/2017 |
| KR | 101932279 B1 | 1/2019 |
| KR | 101945425 B1 | 2/2019 |
| KR | 20190026202 A | 3/2019 |
| KR | 20190048673 A | 5/2019 |
| KR | 20190089457 A | 7/2019 |
| WO | 2019103364 A1 | 5/2019 |

OTHER PUBLICATIONS

International Search Report for Application No. PCT/KR2020/012441 dated Jan. 4, 2021, pp. 1-3.

* cited by examiner

FIG. 6

BATTERY MANAGEMENT SYSTEM, BATTERY MANAGEMENT METHOD, BATTERY PACK AND ELECTRIC VEHICLE

CROSS-REFERENCE TO RELATED APPLICATIONS

The present application is a national phase entry under 35 U.S.C. § 371 of International Application No. PCT/KR2020/012441 filed Sep. 15, 2020, published in Korean, which claims priority from Korean Patent Application No. 10-2019-0116945 filed Sep. 23, 2019, all of which are incorporated herein by reference.

TECHNICAL FIELD

The present disclosure relates to technology that diagnoses the state of a power line for receiving power from a battery group.

The present application claims priority to Korean Patent Application No. 10-2019-0116945 filed in the Republic of Korea on Sep. 23, 2019, the disclosure of which is incorporated herein by reference.

BACKGROUND ART

Recently, there has been a dramatic increase in demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A battery pack applied to an electric vehicle generally includes a plurality of battery groups connected in series and a battery management system. The battery management system monitors the voltage of each battery cell included in the battery group. Recently, to meet the demand for high capacity high output battery packs, the number of battery groups in the battery pack is increasing.

A single master-multi slave structure for efficiently managing each battery group included in the battery pack includes a plurality of slave controllers provided in a one-to-one correspondence relationship with the plurality of battery groups and a master controller that controls all the plurality of slave controllers.

Meanwhile, respective slave controller may use the battery group arranged to be monitored by the corresponding slave controller as power sources for operation. When a high voltage node of the battery group is connected to a power terminal of the slave controller through a power line, power is supplied from the battery group to the slave controller.

However, when the power line is broken by external impacts, overheat or ageing, the slave controller may become unintentionally inoperable.

SUMMARY

Technical Problem

The present disclosure is designed to solve the above-described problem, and therefore the present disclosure is directed to providing a battery management system, a battery pack and an electric vehicle for supplying power from a battery group to a slave controller through a sensing line connected to a battery cell included in the battery group even if a power line provided for transmitting power between the battery group and the slave controller is open circuited.

The present disclosure is further directed to providing a battery management system, a battery management method, a battery pack and an electric vehicle for diagnosing the state of a power line based on a power consumption difference between two operation modes that can be executed by a slave controller.

These and other objects and advantages of the present disclosure may be understood by the following description and will be apparent from the embodiments of the present disclosure. In addition, it will be easily understood that the objects and advantages of the present disclosure may be realized by the means set forth in the appended claims and a combination thereof.

Technical Solution

A battery management system according to an aspect of the present disclosure includes a first connection unit, a first slave controller and a master controller. The first connection unit includes a first power line, a first sensing line, a second sensing line and a first diode. The first diode is connected between the first sensing line and the first power line. The first slave controller includes a first power terminal connected to a positive terminal of a first battery cell included in a first battery group through the first power line, a first sensing terminal connected to the positive terminal of the first battery cell through the first sensing line and a second sensing terminal connected to a negative terminal of the first battery cell through the second sensing line. The master controller is operably coupled to the first slave controller. The first slave controller is configured to execute a first communication mode and a second communication mode in a sequential order in response to a first diagnosis request signal from the master controller. An amount of power required to execute the first communication mode is different from an amount of power required to execute the second communication mode. The first slave controller is configured to determine a first reference voltage value indicating a voltage of the first battery cell during the execution of the first communication mode. The first slave controller is configured to determine a first comparative voltage value indicating a voltage of the first battery cell during the execution of the second communication mode. The master controller is configured to determine whether the first power line has an open circuit fault based on the first reference voltage value and the first comparative voltage value.

A cathode of the first diode may be connected to the first power line. An anode of the first diode may be connected to the first sensing line.

A resistance value of the first sensing line may be greater than a resistance value of the first power line.

The master controller may be configured to determine that the first power line has an open circuit fault in response to an absolute value of a difference between the first reference voltage value and the first comparative voltage value being larger than a threshold value.

The first slave controller may further include a first communication module and a second communication module. The first slave controller may be configured to activate both the first communication module and the second communication module when executing the first communication mode. The first slave controller may be configured to activate the first communication module and deactivate the second communication module when executing the second communication mode.

The battery management system may further include a second connection unit and a second slave controller. The second connection unit may include a second power line, a third sensing line, a fourth sensing line and a second diode. The second diode may be connected between the third sensing line and the second power line. The second slave controller may include a second power terminal connected to a positive terminal of a second battery cell included in a second battery group connected in series to the first battery group through the second power line, a third sensing terminal connected to the positive terminal of the second battery cell through the third sensing line and a fourth sensing terminal connected to a negative terminal of the second battery cell through the fourth sensing line.

The second slave controller may be configured to execute the first communication mode and the second communication mode in a sequential order in response to a second diagnosis request signal from the master controller. The second slave controller may be configured to determine a second reference voltage value indicating a voltage of the second battery cell during the execution of the first communication mode. The second slave controller may be configured to determine a second comparative voltage value indicating a voltage of the second battery cell during the execution of the second communication mode. The second slave controller may be configured to wherein the master controller is configured to determine whether the second power line has an open circuit fault based on the second reference voltage value and the second comparative voltage value.

The second slave controller may further include a third communication module and a fourth communication module. The second slave controller may be configured to activate both the third communication module and the fourth communication module when executing the first communication mode. The second slave controller may be configured to activate the third communication module and deactivate the fourth communication module when executing the second communication mode.

A battery pack according to another aspect of the present disclosure includes the battery management system of any of the embodiments described herein.

An electric vehicle according to still another aspect of the present disclosure includes the battery pack of any of the embodiments described herein.

A battery management method according to yet another aspect of the present disclosure uses the battery management system of any of the embodiments described herein. The battery management method includes executing, by the first slave controller, a first communication mode and a second communication mode in a sequential order in response to a first diagnosis request signal from the master controller, wherein an amount of power required to execute the first communication mode is different from an amount of power required to execute the second communication mode, determining, by the first slave controller, a first reference voltage value indicating a voltage of the first battery cell during the execution of the first communication mode, determining, by the first slave controller, a first comparative voltage value indicating a voltage of the first battery cell during the execution of the second communication mode, transmitting, by the first slave controller, a first response signal including the first reference voltage value and the first comparative voltage value to the master controller, and determining, by the master controller, whether the first power line has the open circuit fault based on the first reference voltage value and the first comparative voltage value in response to the first response signal being received by the master controller.

When the first communication mode is executed, both the first communication module and the second communication module may be activated. When the second communication mode is executed, the first communication module may be activated and the second communication module may be deactivated.

The step of determining whether the first power line has an open circuit fault may be based on an absolute value of a difference between the first reference voltage value and the first comparative voltage value being larger than a threshold value.

Advantageous Effects

According to at least one of the embodiments of the present disclosure, it is possible to supply power from a battery group to a slave controller through a sensing line connected to a battery cell included in the battery group when a power line provided for transmitting power between the battery group and the slave controller is open circuited.

In addition, it is possible to diagnose the state of the power line based on a power consumption difference between two operation modes that can be executed by the slave controller.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware or software alone or in combination.

In addition, throughout the specification, it will be further understood that when an element is referred to as being "connected to" another element, it can be directly connected to the other element or intervening elements may be present.

Figure 1:
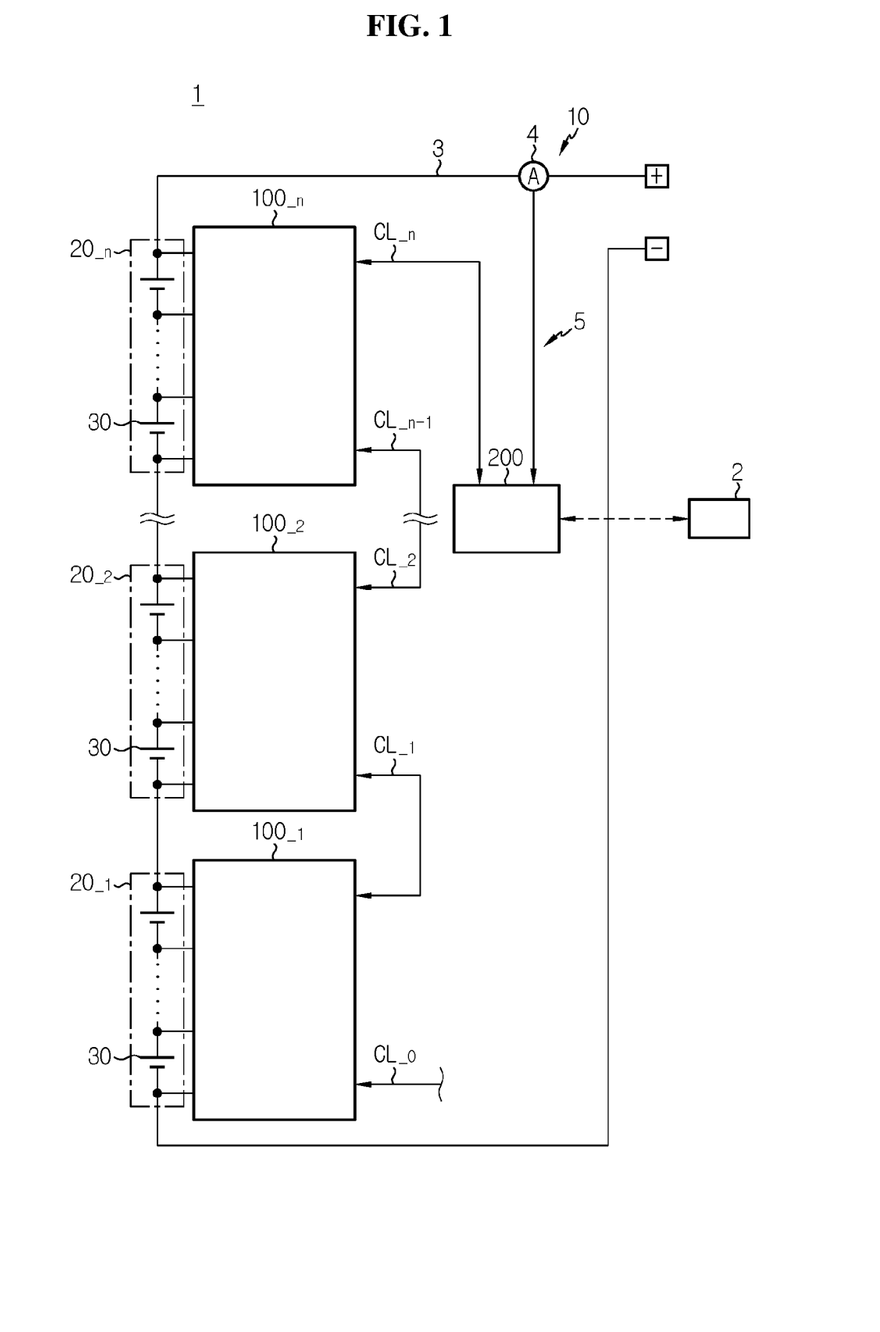
FIG. 1 is a diagram exemplarily showing a configuration of an electric vehicle according to an embodiment of the present disclosure.
Figure 2:
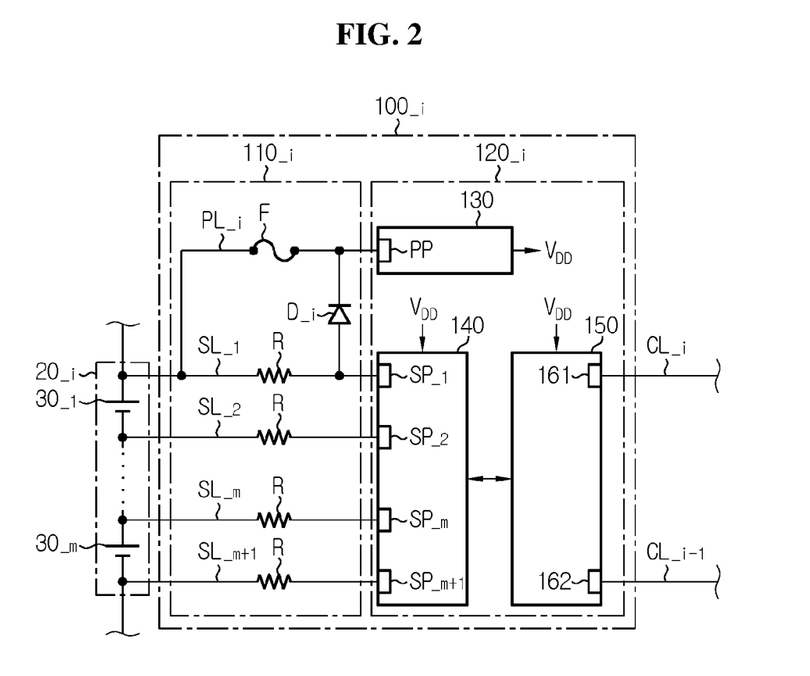
FIG. 2 is a diagram exemplarily showing a detailed configuration of a cell management apparatus of FIG. 1.

FIG. 1 is a diagram exemplarily showing a configuration of an electric vehicle according to an embodiment of the present disclosure, and FIG. 2 is a diagram exemplarily showing a detailed configuration of a cell management apparatus of FIG. 1.

Referring to FIGS. 1 and 2, the electric vehicle 1 includes a battery pack 10 and a high level controller 2. The electric vehicle 1 may further include a direct current (DC)-alternating current (AC) inverter (not shown) and an electric motor (not shown).

The battery pack 10 includes n battery groups $20_{\_1} \sim 20_{\_n}$ and a battery management system 5. The $1^{st}$ to $n^{th}$ battery groups $20_{\_1} \sim 20_{\_n}$ are electrically connected in series by a charge/discharge line 3. The battery management system 5 includes n cell management apparatuses $100_{\_1} \sim 100_{\_n}$, and a master controller 200. n is a natural number of 1 or greater.

When i is a natural number that is equal to or less than n, the battery group 20 includes m battery cells $30_{\_1} \sim 30_{\_m}$. m is a natural number of 1 or greater. The battery cell 30 may include any type of rechargeable batteries such as lithium ion cells and is not limited to a particular type. When m is equal to or greater than 2, the battery cells $30_{\_1} \sim 30_{\_m}$ are electrically connected in series. When j is a natural number that is less than m, a negative terminal of the battery cell $30_{\_j}$ may be electrically connected to a positive terminal of the battery cell $30_{\_j+1}$ in the battery group $20_{\_i}$.

In the battery group $20_{\_i}$, the battery cell $30_{\_1}$ has the highest potential among the battery cells $30_{\_1} \sim 30_{\_m}$, and the battery cell $30_{\_1}$ of the battery group $20_{\_i}$ may be referred to as '$i^{th}$ highest potential cell' or '$i^{th}$ high voltage cell'.

The cell management apparatus $100_{\_i}$ includes a connection unit $110_{\_i}$ and a slave controller $120_{\_i}$.

The connection unit $110_{\_i}$ includes a power line $PL_{\_i}$, sensing lines $SL_{\_1} \sim SL_{\_m+1}$ and a diode $D_{\_i}$. The positive terminal and the negative terminal of each of the battery cells $30_{\_1} \sim 30_{\_m}$ of the battery group 20 are electrically connected to the slave controller 120 through the connection unit $110_{\_i}$.

The first end of the power line PL is electrically connected to the positive terminal of the battery cell $30_{\_1}$. The second end of the power line $PL_{\_i}$ is electrically connected to the slave controller $120_{\_i}$. The power line PL may include a fuse F.

The first end of the sensing line $SL_{\_1}$ is electrically connected to the positive terminal of the battery cell $30_{\_1}$. The second end of the sensing line $SL_{\_1}$ is electrically connected to the slave controller $120_{\_i}$. When h is a natural number that is equal to 2 m+1, the first end of the sensing line $SL_{\_h}$ is electrically connected to the negative terminal of the battery cell $30_{\_h-1}$, and the second end of the sensing line $SL_{\_h}$ is electrically connected to the slave controller $120_{\_i}$.

Each of the sensing lines $SL_{\_1} \sim SL_{\_m+1}$ may include a protection resistor R. The protection resistor R may have a predetermined resistance value (for example, 10 KΩ), and protect the slave controller $120_{\_i}$ from surge voltages from the battery cells $30_{\_1} \sim 30_{\_m}$ by the protection resistor R.

The resistance value of each sensing line $SL_{\_1} \sim SL_{\_m+1}$ may be equal to or larger than the resistance value of the power line $PL_{\_i}$. For example, a ratio of the resistance value of the sensing lines $SL_{\_1} \sim SL_{\_m+1}$ to the resistance value of the power line PL may be equal to or larger than a predetermined reference value (for example, 10).

The diode $D_{\_i}$ is electrically connected between the power line PL and the sensing line $SL_{\_1}$. In detail, the diode $D_{\_i}$ is connected in parallel to a series circuit of the protection resistor R of the sensing line $SL_{\_1}$ and the power line $PL_{\_i}$. As shown in FIG. 2, the anode of the diode $D_{\_i}$ is connected to the second end of the sensing line $SL_{\_1}$, and the cathode of the diode $D_{\_i}$ is connected to the second end of the power line $PL_{\_i}$.

The slave controller 120 is provided to monitor the state (for example, voltage, temperature) of each battery cell $30_{\_1} \sim 30_{\_m}$ included in the battery group $20_{\_i}$. The slave controller $120_{\_i}$ includes a power generation circuit 130, a voltage detection circuit 140 and a control unit 150.

The power generation circuit 130 includes a power terminal PP. The power terminal PP is electrically connected to the second end of the power line $PL_{\_i}$. The power generation circuit 130 may be, for example, a DC-DC converter. The power generation circuit 130 generates power voltage $V_{DD}$ by DC-DC conversion of the power supplied from the battery group $20_{\_i}$ to the power terminal PP through the power line $PL_{\_i}$. The power voltage $V_{DD}$ is supplied to the voltage detection circuit 140 and the control unit 150. The voltage detection circuit 140 and the control unit 150 operate by the power voltage $V_{DD}$. Although not shown, the negative terminal of the battery cell $30_{\_m}$ may be used as the ground of the power generation circuit 130.

In the connection unit $110_{\_i}$, when both the power line $PL_{\_i}$ and the sensing line $SL_{\_1}$ are in normal condition, the potential of the cathode of the diode $D_{\_i}$ is equal to or higher than the potential of the anode of the diode $D_{\_i}$. Accordingly, the power from the battery group 20 is supplied to the power generation circuit 130 through only the power line PL by interruption of the electric current of the diode $D_{\_i}$.

In contrast, when the sensing line $SL_{\_1}$ is in normal condition but the power line $PL_{\_i}$ has an open circuit fault, the potential of the anode of the diode $D_{\_i}$ is higher than the potential of the cathode of the diode $D_{\_i}$. Accordingly, the power from the battery group $20_{\_i}$ is supplied to the power generation circuit 130 through the sensing line $SL_{\_1}$ and the diode $D_{\_i}$. That is, when the power line PL is open circuited, the sensing line $SL_{\_1}$ and the diode $D_{\_i}$ may function as an extra power line.

The voltage detection circuit 140 includes sensing terminals $SP_{\_1} \sim SP_{\_m+1}$. The sensing terminal $SP_{\_1}$ is electrically connected to the second end of the sensing line $SL_{\_1}$. When h=2~m+1, the sensing terminal $SP_{\_h}$ is electrically connected to the second end of the sensing line $SL_{\_h}$. The voltage detection circuit 140 detects a potential difference between the sensing terminal $SP_{\_h-1}$ and the sensing terminal SP h as voltage of the battery cell $30_{\_h-1}$. The voltage detection circuit 140 transmits cell voltage information indicating the detected voltage of each battery cell $30_{\_1} \sim 30_{\_m}$ to the control unit 150. The control unit 150 is operably coupled to the power generation circuit 130, the voltage detection circuit 140 and the master controller 200. The control unit 150 determines a voltage value indicating the voltage of each battery cell $30\_1\sim30\_m$ using the voltage detection circuit 140 via data communication with the master controller 200.

The control unit 150 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions. The control unit 150 may include a memory therein. The memory may store programs and data required for performing a method as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The slave controllers $120\_1\sim120\_n$ and the master controller 200 may be connected in the form of a daisy chain or a loop through a communication channel to perform bidirectional data communication between them.

The control unit 150 includes two communication modules 161, 162. The communication module 161 is connected to the master controller 200 or the slave controller $120\_{i+1}$ through a communication line $CL\_i$. The communication module 162 may be positioned in connection or non-connection to the slave controller 120 or the master controller 200 through the communication line $CL\_{i-1}$. The communication modules 161, 162 may use the well-known communication protocol such as Controller Area Network (CAN) for bidirectional data communication with another slave controller 120 and/or the master controller 200.

The master controller 200 150 may be also implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions. The master controller 200 may include a memory therein. The memory may store programs and data required for performing a method as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The master controller 200 is operably coupled to the slave controllers $120\_1\sim120\_n$ and the high level controller 2. The master controller 200 may transmit information associated with the slave controllers $120\_1\sim120\_n$ to the high level controller 2, and receive a corresponding command from the high level controller 2. The high level controller 2 may be, for example, an Electronic Control Unit (ECU) of the electric vehicle 1 to which the battery pack 10 is applied.

The master controller 200 may be electrically connected to a current detection circuit 4 installed on the charge/discharge line 3 to acquire a current signal from the current detection circuit 4, and the current signal indicates the electric current detected by the current detection circuit 4.

The master controller 200 may determine a State Of Charge (SOC) and a State Of Health (SOH) of each battery cell $30\_1\sim30\_m$ of the battery group 20 based on the current signal from the current detection circuit 4 and the cell voltage information from the slave controller $120\_i$.

When a preset event occurs, the master controller 200 may execute a diagnosis mode. The diagnosis mode is a mode for diagnosing the power line PL of each cell management apparatus $100\_1\sim100\_n$. For example, the master controller 200 may execute the diagnosis mode in response to a standby command received from the high level controller 2. The standby command may be a message requesting to change the slave controllers $120\_1\sim120\_n$ from a wakeup state to a sleep state.

When the diagnosis mode is executed, the master controller 200 may sequentially transmit a diagnosis request signal to the slave controllers $120\_1\sim120\_n$ according to a preset rule. For example, the master controller 200 may sequentially transmit the diagnosis request signal to the slave controllers $120\_1\sim120\_n$ on the basis of the communication distance from the master controller 200. For example, the master controller 200 may first transmit the diagnosis request signal for the slave controller $120\_i$ having a longest communication distance from the master controller 200, and may transmit last the diagnosis request signal for the slave controller $120\_n$ having a shortest communication distance from the master controller 200. Additionally, after the master controller 200 receives a response signal from the slave controller $120\_i$, the master controller 200 may transmit the diagnosis request signal for the slave controller $120\_{i+1}$.

Alternatively, the master controller 200 does not repeatedly transmit the diagnosis request signal, and instead, each slave controller 120 may transmit the response signal to the master controller 200 and then transmit the diagnosis request signal to the next slave controller 120.

Figure 3:
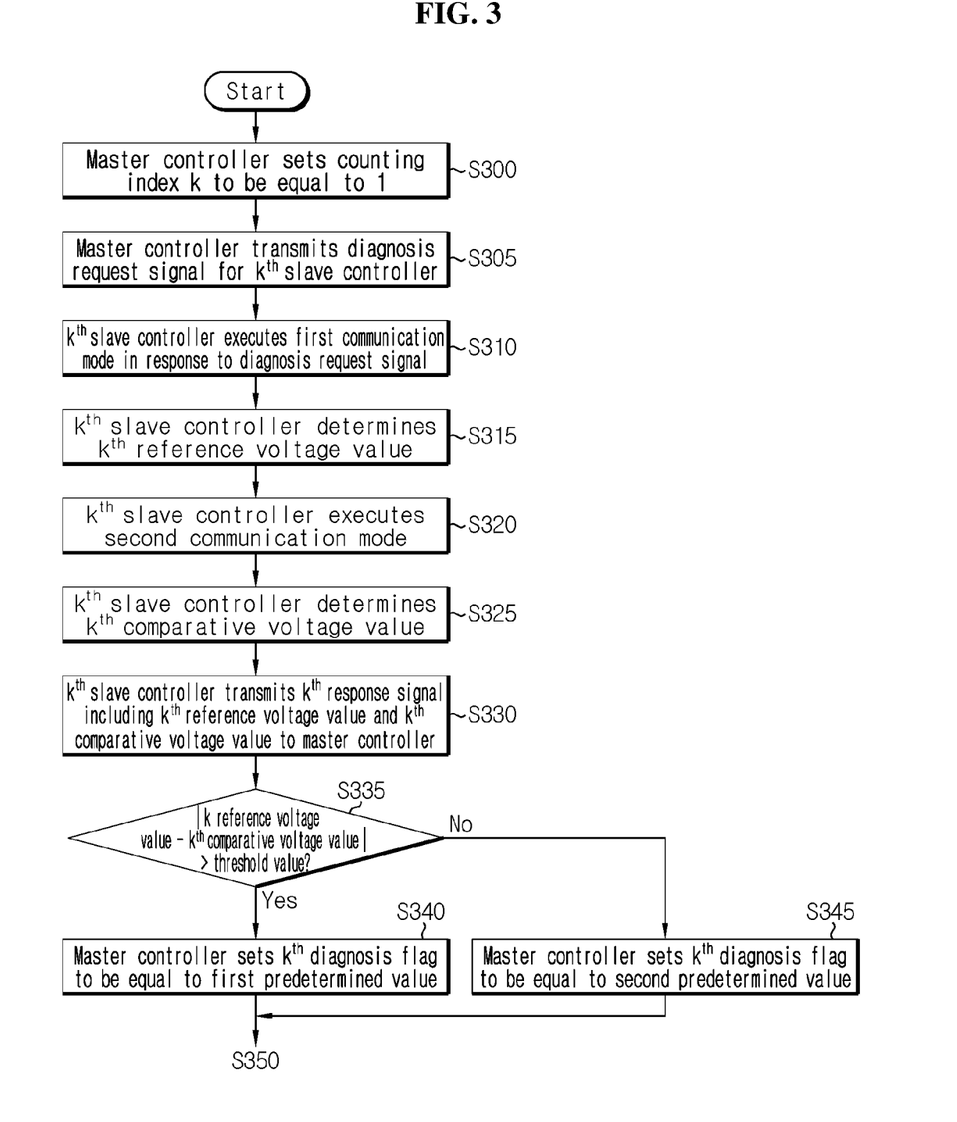
FIGS. 3 and 4 are flowcharts exemplarily showing a battery management method using the battery management system of FIG. 1.
Figure 4:
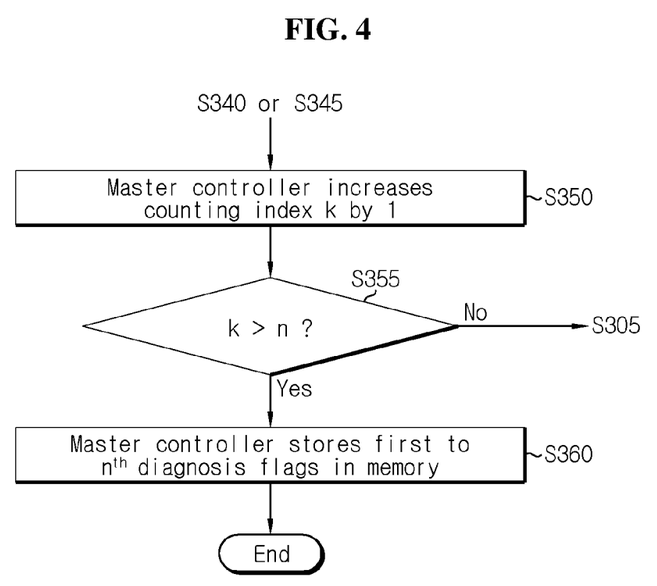
Figure 5:
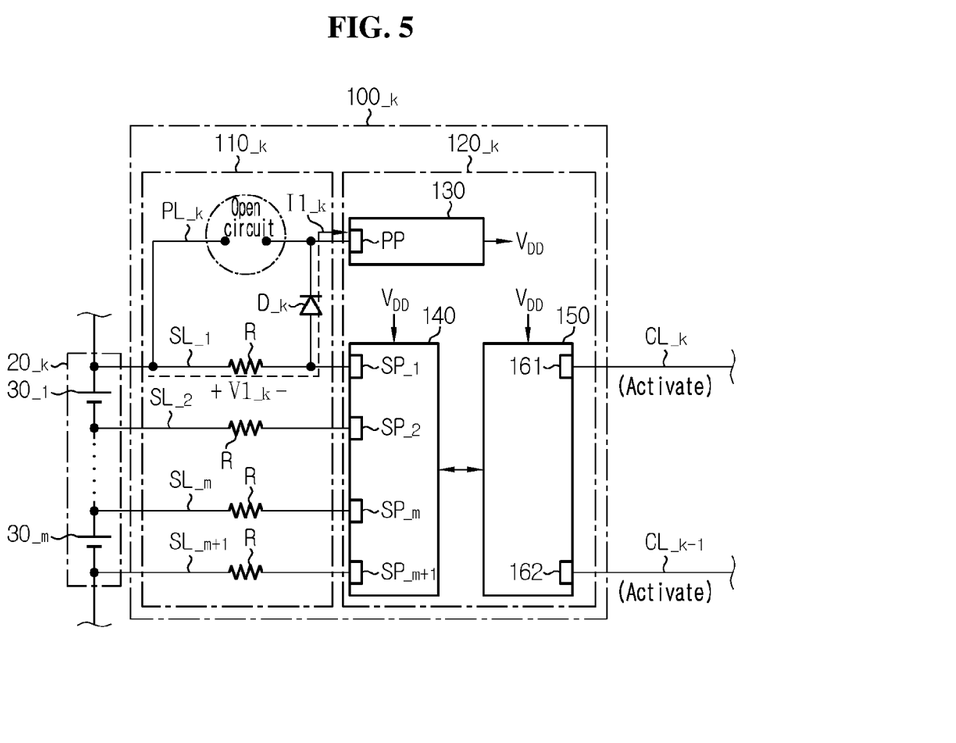
FIGS. 5 and 6 are diagrams for reference in describing the battery management method according to FIGS. 3 and 4.
Figure 6:
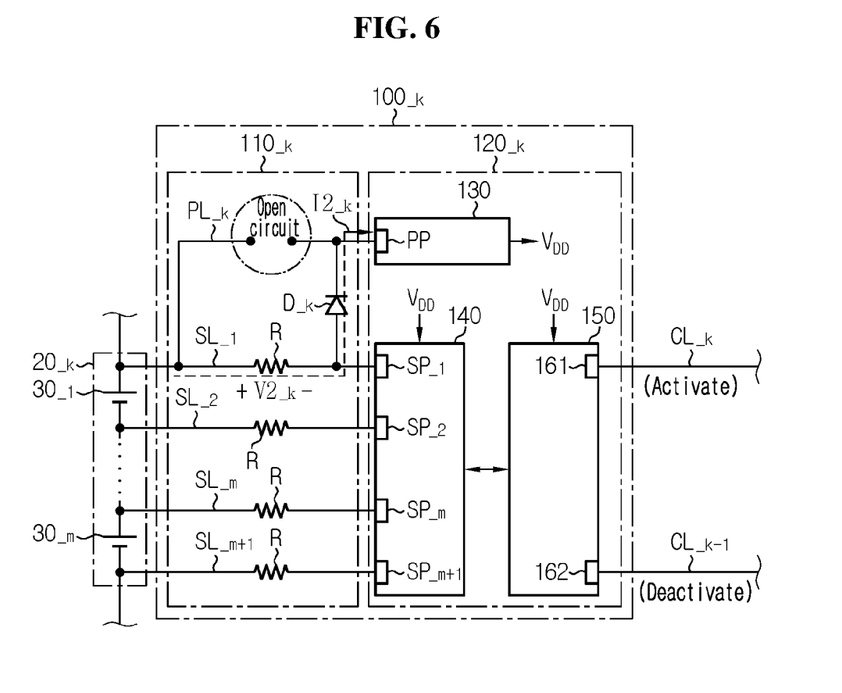

FIGS. 3 and 4 are flowcharts exemplarily showing a battery management method using the battery management system of FIG. 1, and FIGS. 5 and 6 are diagrams for reference in describing the battery management method according to FIGS. 3 and 4. The battery management method of FIGS. 3 and 4 may start when the master controller 200 executes the diagnosis mode in the wakeup state of the slave controllers $120\_1\sim120\_n$.

Referring to FIGS. 3 to 6, in step S300, the master controller 200 sets a counting index k to be equal to 1.

In step S305, the master controller 200 transmits a diagnosis request signal for the $k^{th}$ slave controller $120\_k$. That is, the master controller 200 selects the $k^{th}$ slave controller $120\_k$ corresponding to an order indicated by the counting index k from the slave controllers $120\_1\sim120\_n$. The diagnosis request signal transmitted in the step S305 may be transmitted to the communication module 161 of the $k^{th}$ slave controller $120\_k$ through the slave controllers $120\_{k+1}\sim120\_n$ and the communication lines $CL\_{k+1}\sim CL\_n$.

In step S310, the $k^{th}$ slave controller $120\_k$ executes a first communication mode in response to the diagnosis request signal.

In step S315, the $k^{th}$ slave controller $120\_k$ determines a $k^{th}$ reference voltage value indicating the voltage of the battery cell $30\_1$ of the battery group $20\_k$ detected during the execution of the first communication mode. For example, the $k^{th}$ reference voltage value may be an average of voltages of the battery cell $30\_1$ sequentially measured a first number of times (for example, 10 times) for a first period (for example, 0.5 sec) during the execution of the first communication mode. When the $k^{th}$ reference voltage value is determined, the first communication mode may end.

In step S320, the $k^{th}$ slave controller $120\_k$ executes a second communication mode.

In step S325, the $k^{th}$ slave controller $120_{-k}$ determines a $k^{th}$ comparative voltage value indicating the voltage of the battery cell $30_{-1}$ of the battery group $20_{-k}$ detected during the execution of the second communication mode. For example, the $k^{th}$ comparative voltage value may be an average of voltages of the battery cell $30_{-1}$ sequentially measured a second number of times (for example, 10 times) for a second period (for example, 0.5 sec) during the execution of the second communication mode. When the $k^{th}$ comparative voltage value is determined, the second communication mode may end. In step S315 or S325, a voltage value indicating the voltage of each of the remaining battery cells $30_{-2}$~$30_{-m}$ of the battery group $20_{-k}$ may be additionally determined by the $k^{th}$ slave controller $120_{-k}$.

The $k^{th}$ slave controller $120_{-k}$ may keep the communication module 161 in active state even though any one of the first communication mode and the second communication mode is executed. Additionally, the $k^{th}$ slave controller $120_{-k}$ may deactivate the communication module 162 during any one of the first communication mode and the second communication mode, and may activate the communication module 162 during the other communication mode. For example, the $k^{th}$ slave controller $120_{-k}$ may activate both the communication module 161 and the communication module 162 during the first communication mode. In contrast, the $k^{th}$ slave controller $120_{-k}$ may activate the communication module 161 but deactivate the communication module 162 during the second communication mode. Those skilled in the art will easily understood that the amount of power required to activate both the communication module 161 and the communication module 162 is higher than the amount of power required to activate only the communication module 161. That is, the amount of power required to execute the first communication mode is different from the amount of power required to execute the second communication mode.

When the power line $PL_{-k}$ of the connection unit $110_{-k}$ is open circuited, since the electric current flows through the sensing line $SL_{-1}$ and the diode $D_{-k}$ of the connection unit $110_{-k}$, a larger voltage drop occurs over the sensing line $SL_{-1}$ than the case in which the power line $PL_{-k}$ is not open circuited.

FIG. 5 shows an exemplary situation in which the $k^{th}$ slave controller $120_{-k}$ executes the first communication mode when an open circuit fault occurs in the power line $PL_{-k}$ of the connection unit $110_{-k}$. Referring to FIG. 5, while power required to execute the first communication mode is supplied to the power generation circuit 130 in the flow of electric current $I1_{-k}$ through the sensing line $SL_1$ of the connection unit $110_{-k}$, a voltage drop $V1_{-k}$ across the sensing line $SL_{-1}$ occurs by the Ohm's law. Accordingly, the $k^{th}$ reference voltage value determined in the step S315 indicates a voltage that is lower by the voltage drop $V1_{-k}$ than the actual voltage of the battery cell $30_{-1}$ of the battery group $20_{-k}$. FIG. 6 shows a situation in which the $k^{th}$ slave controller $120_{-k}$ executes the second communication mode when an open circuit fault occurs in the power line $PL_{-k}$ of the connection unit $110_{-k}$. Referring to FIG. 6, while power required to execute the second communication mode is supplied to the power generation circuit 130 in the flow of electric current $I2_{-k}$ through the sensing line $SL_{-1}$ of the connection unit $110_{-k}$, a voltage drop $V2_{-k}$ across the sensing line $SL_{-1}$ occurs. Accordingly, the $k^{th}$ comparative voltage value determined in the step S325 indicates a voltage that is lower by the voltage drop $V2_{-k}$ than the actual voltage of the battery cell $30_{-1}$ of the battery group $20_{-k}$. As the electric current $I1_{-k}$ and the electric current $I2_{-k}$ are different from each other, the voltage drop $V1_{-k}$ and the voltage drop $V2_{-k}$ are also different from each other. Accordingly, there is a difference between the $k^{th}$ reference voltage value and the $k^{th}$ comparative voltage value corresponding to a difference between the voltage drop $V1_{-k}$ and the voltage drop $V2_{-k}$.

On the contrary, when the power line $PL_{-k}$ of the connection unit $110_{-k}$ is not open circuited and is in normal state, power from the battery group 20 is supplied to the power generation circuit 130 through only the power line $PL_{-k}$. Accordingly, even though any one of the first communication mode and the second communication mode is executed, a drop voltage does not occur across the sensing line $SL_{-1}$. Accordingly, as opposed to the open circuit situation of the power line $PL_{-k}$ of the connection unit $110_{-k}$ shown in FIGS. 5 and 6, the $k^{th}$ reference voltage value determined in the step S315 and the $k^{th}$ comparative voltage value determined in the step S325 are equal or have a difference less than a predetermined level.

In step S330, the $k^{th}$ slave controller $120_{-k}$ transmits a $k^{th}$ response signal including the $k^{th}$ reference voltage value and the $k^{th}$ comparative voltage value to the master controller 200. The $k^{th}$ response signal may further include a voltage value indicating the voltage of each battery cell $30_{-2}$~$30_{-m}$. The $k^{th}$ slave controller $120_{-k}$ may change to the sleep state after transmitting the $k^{th}$ response signal to the master controller 200.

In step S335, the master controller 200 determines whether an absolute value of a difference between the $k^{th}$ reference voltage value and the $k^{th}$ comparative voltage value included in the $k^{th}$ response signal is larger than a threshold value. The threshold value may be a value that is preset based on the experimental results of the electric current consumed in the first communication mode and the electric current consumed in the second communication mode that is different from the first communication mode. A value of the step S335 being "Yes" indicates that the power line $PL_{-k}$ of the connection unit $110_{-k}$ has an open circuit fault. The value of the step S335 being "No" indicates that the power line $PL_{-k}$ of the connection unit $110_{-k}$ is in normal state. When the value of the step S335 is "Yes", step S340 is performed. When the value of the step S335 is "No", step S345 is performed.

In step S340, the master controller 200 sets a $k^{th}$ diagnosis flag to be equal to a first predetermined value (for example, 1). The first predetermined value indicates that the power line $PL_{-k}$ of the connection unit $110_{-k}$ is open circuited. In addition, the master controller 200 may compensate for the $k^{th}$ reference voltage value by adding a first compensation value to the $k^{th}$ reference voltage value, or may compensate for the $k^{th}$ comparative voltage value by adding a second compensation value to the $k^{th}$ comparative voltage value. The first compensation value may be a preset value corresponding to the multiplication of the electric current consumed in the first communication mode by the resistance value of the sensing line $SL_{-1}$. The second compensation value may be a preset value corresponding to the multiplication of the electric current consumed in the second communication mode by the resistance value of the sensing line $SL_{-1}$. Each of the compensated $k^{th}$ reference voltage value and the compensated $k^{th}$ comparative voltage value indicates the estimated value of the actual voltage of the battery cell $30_{-1}$ of the battery group $20_{-k}$. Instead of the $k^{th}$ reference voltage value or the $k^{th}$ comparative voltage value, the master controller 200 may use the compensated $k^{th}$ reference voltage value or the compensated $k^{th}$ comparative voltage value to determine the SOC of the $k^{th}$ high voltage cell $30_{-1}$.

In step S345, the master controller 200 sets the k$^{th}$ diagnosis flag to be equal to a second predetermined value (for example, 0). The second predetermined value indicates that the power line PL$_{-k}$ of the connection unit 110$_{-k}$ is not open circuited.

In this instance, to prevent an incorrect diagnosis caused by the discharge of the battery group 20$_{-k}$ during the period of time from the step S315 to the step S325, a time difference between the step S315 and the step S325 may be set to be equal to or less than a predetermined reference time (for example, 0.1 sec). Accordingly, the actual voltage of the battery cell 30$_{-1}$ at the moment of determining the k$^{th}$ reference voltage value and the actual voltage of the battery cell 30$_{-1}$ at the moment of determining the k$^{th}$ comparative voltage value may be treated as being substantially equal to each other, thereby preventing an incorrect determination in the step S335.

In step S350, the master controller 200 increases the counting index k by 1.

In step S355, the master controller 200 determines whether the counting index k is larger than n. A value of the step S355 being "Yes" indicates that the diagnosis of the power line units PL$_{-k}$ included in the connection units 110$_{-1}$~100$_{-n}$ is completed. When the value of the step S355 is "Yes", step S360 is performed. The value of the step S355 being "No" indicates that the diagnosis of the power line PL included in each of the connection units 110$_{-k+1}$~100$_n$ is not yet completed. When the value of the step S355 is "No", the process reverts to the step S305.

In step S360, the master controller 200 may store first to n$^{th}$ diagnosis flags in the memory of the master controller 200. In addition, the master controller 200 may transmit the first to n$^{th}$ diagnosis flags to the high level controller 2. The high level controller 2 may output a message indicating that the connection unit 110 related to each diagnosis flag set to the first predetermined value has an open circuit fault to a remote server or a vehicle user.

Alternatively, when the k$^{th}$ slave controller 120$_{-k}$ receives a k$^{th}$ diagnosis request signal, the k$^{th}$ slave controller 120$_{-k}$ may execute an operation mode that is different from the first communication mode and the second communication mode. For example, in step S310, the k$^{th}$ slave controller 120$_{-k}$ may execute a first voltage detection mode, and in step S320, the k$^{th}$ slave controller 120$_{-k}$ may execute a second voltage detection mode. The first voltage detection mode may be a mode for determining the k$^{th}$ reference voltage value at a first sampling rate (for example, 100 times/sec), and the second voltage detection mode may be a mode for determining the k$^{th}$ comparative voltage value at a second sampling rate (for example, 200 times/sec) that is different from the first sampling rate. That is, the operation modes executed in the steps S310 and S320 are not limited to the first communication mode and the second communication mode, and two modes having different power consumption per unit time may be each executed in the steps S310 and S320.

The embodiments of the present disclosure described hereinabove are not implemented only through the apparatus and method, and may be implemented through programs that realize the functions corresponding to the configurations of the embodiments of the present disclosure or recording media having the programs recorded thereon, and such implementation may be easily achieved by those skilled in the art from the disclosure of the embodiments previously described.

Additionally, as many substitutions, modifications and changes may be made to the present disclosure by those skilled in the art without departing from the technical aspects of the present disclosure, the present disclosure is not limited by the foregoing embodiments and the accompanying drawings, and some or all of the embodiments may be selectively combined to make various modifications to the present disclosure.

What is claimed is:

1. A battery management system, comprising:
    a first connection unit including a first power line, a first sensing line, a second sensing line and a first diode connected between the first sensing line and the first power line;
    a first slave controller including a first power terminal connected to a positive terminal of a first battery cell included in a first battery group through the first power line, a first sensing terminal connected to the positive terminal of the first battery cell through the first sensing line and a second sensing terminal connected to a negative terminal of the first battery cell through the second sensing line; and
    a master controller operably coupled to the first slave controller,
    wherein the first slave controller is configured to:
    execute a first communication mode and a second communication mode in a sequential order in response to a first diagnosis request signal from the master controller, wherein an amount of power required to execute the first communication mode is different from an amount of power required to execute the second communication mode,
    determine a first reference voltage value indicating a voltage of the first battery cell during the execution of the first communication mode, and
    determine a first comparative voltage value indicating a voltage of the first battery cell during the execution of the second communication mode, and
    wherein the master controller is configured to determine whether the first power line has an open circuit fault based on the first reference voltage value and the first comparative voltage value.

2. The battery management system according to claim 1, wherein a cathode of the first diode is connected to the first power line, and
    an anode of the first diode is connected to the first sensing line.

3. The battery management system according to claim 1, wherein a resistance value of the first sensing line is greater than a resistance value of the first power line.

4. The battery management system according to claim 1, wherein the master controller is configured to determine that the first power line has the open circuit fault in response to an absolute value of a difference between the first reference voltage value and the first comparative voltage value being larger than a threshold value.

5. The battery management system according to claim 1, wherein the first slave controller further includes a first communication module and a second communication module, and
    the first slave controller is configured to:
    activate both the first communication module and the second communication module when executing the first communication mode, and
    activate the first communication module and deactivate the second communication module when executing the second communication mode.

6. The battery management system according to claim 1, further comprising:

a second connection unit including a second power line, a third sensing line, a fourth sensing line and a second diode connected between the third sensing line and the second power line; and a second slave controller including a second power terminal connected to a positive terminal of a second battery cell included in a second battery group connected in series to the first battery group through the second power line, a third sensing terminal connected to the positive terminal of the second battery cell through the third sensing line and a fourth sensing terminal connected to a negative terminal of the second battery cell through the fourth sensing line.

7. The battery management system according to claim 6, wherein the second slave controller is configured to:

execute the first communication mode and the second communication mode in a sequential order in response to a second diagnosis request signal from the master controller, determine a second reference voltage value indicating a voltage of the second battery cell during the execution of the first communication mode, and determine a second comparative voltage value indicating a voltage of the second battery cell during the execution of the second communication mode, and wherein the master controller is configured to determine whether the second power line has an open circuit fault based on the second reference voltage value and the second comparative voltage value.

8. The battery management system according to claim 7, wherein the second slave controller further includes a third communication module and a fourth communication module, and the second slave controller is configured to:

activate both the third communication module and the fourth communication module when executing the first communication mode, and activate the third communication module and deactivate the fourth communication module when executing the second communication mode.

9. A battery pack comprising the battery management system according to claim 1.

10. An electric vehicle comprising the battery pack according to claim 9.

11. A battery management method using a battery management system including a first connection unit including a first power line, a first sensing line, a second sensing line and a first diode connected between the first sensing line and the first power line, a first slave controller including a first power terminal connected to a positive terminal of a first battery cell included in a first battery group through the first power line, a first sensing terminal connected to the positive terminal of the first battery cell through the first sensing line and a second sensing terminal connected to a negative terminal of the first battery cell through the second sensing line, and a master controller operably coupled to the first slave controller, the battery management method comprising:

executing, by the first slave controller, a first communication mode and a second communication mode in a sequential order in response to a first diagnosis request signal from the master controller, wherein an amount of power required to execute the first communication mode is different from an amount of power required to execute the second communication mode;

determining, by the first slave controller, a first reference voltage value indicating a voltage of the first battery cell during the execution of the first communication mode;

determining, by the first slave controller, a first comparative voltage value indicating a voltage of the first battery cell during the execution of the second communication mode;

transmitting, by the first slave controller, a first response signal including the first reference voltage value and the first comparative voltage value to the master controller; and determining, by the master controller, whether the first power line has an open circuit fault based on the first reference voltage value and the first comparative voltage value in response the first response signal being received by the master controller.

12. The battery management method according to claim 11, wherein when the first communication mode is executed, both the first communication module and the second communication module are activated, and when the second communication mode is executed, the first communication module is activated and the second communication module is deactivated.

13. The battery management method according to claim 11, wherein determining whether the first power line has the open circuit fault is based on an absolute value of a difference between the first reference voltage value and the first comparative voltage value being larger than a threshold value.

* * * * *